United States Patent [19]
Pritchard et al.

[11] 4,108,716
[45] Aug. 22, 1978

[54] POLISHING OF CdS CRYSTALS

[75] Inventors: Assunta Anna Pritchard, Brielle; Sigurd Wagner, Holmdel, both of N.J.

[73] Assignee: Bell Telephone Laboratories, Incorporated, Murray Hill, N.J.

[21] Appl. No.: 752,899

[22] Filed: Dec. 22, 1976

[51] Int. Cl.$^2$ ............................................. C09K 13/04
[52] U.S. Cl. ................................... 156/636; 252/79.2
[58] Field of Search .............. 156/635, 636, 637, 645; 252/79.2

[56] References Cited

U.S. PATENT DOCUMENTS

| | | | |
|---|---|---|---|
| 3,436,286 | 4/1969 | Lange | 156/645 |
| 3,629,023 | 12/1971 | Strehlow | 156/636 |
| 3,764,424 | 10/1973 | Sayko | 156/636 |

OTHER PUBLICATIONS

Sullivan et al., "Chemical Polishing of Cadmium Sulfide", *Journal of the Electrochemical Society*, vol. 114 (Mar. 1967), pp. 295–297.

Smith et al., "Chemomechanical Polishing of CdS", *Journal of the Electrochemical Society*, vol. 121 (Aug. 1974), pp. 1064–1066.

Warekois et al., "Crystallographic Polarity in II—VI Compounds", Journal of Applied Physics, vol. 33 (2/62), pp. 690–696.

*The Condensed Chemical Dictionary*, Reinhold Publishing Corp., 7th edition, New York, N.Y., p. 140 (1966).

*Primary Examiner*—David Klein
*Assistant Examiner*—Jerome W. Massie
*Attorney, Agent, or Firm*—Bruce S. Schneider

[57] ABSTRACT

A process for polishing both the cadmium and sulfur face of CdS using buffered HCl solutions has been found to produce very smooth crystal surfaces. Use of HCl solutions buffered to a pH between 2.2 and 2.8 to polish the cadmium face is quite effective. An equally effective polishing agent for the sulfur face is a HCl solution buffered to a pH between 0.7 and 1.3.

4 Claims, 1 Drawing Figure

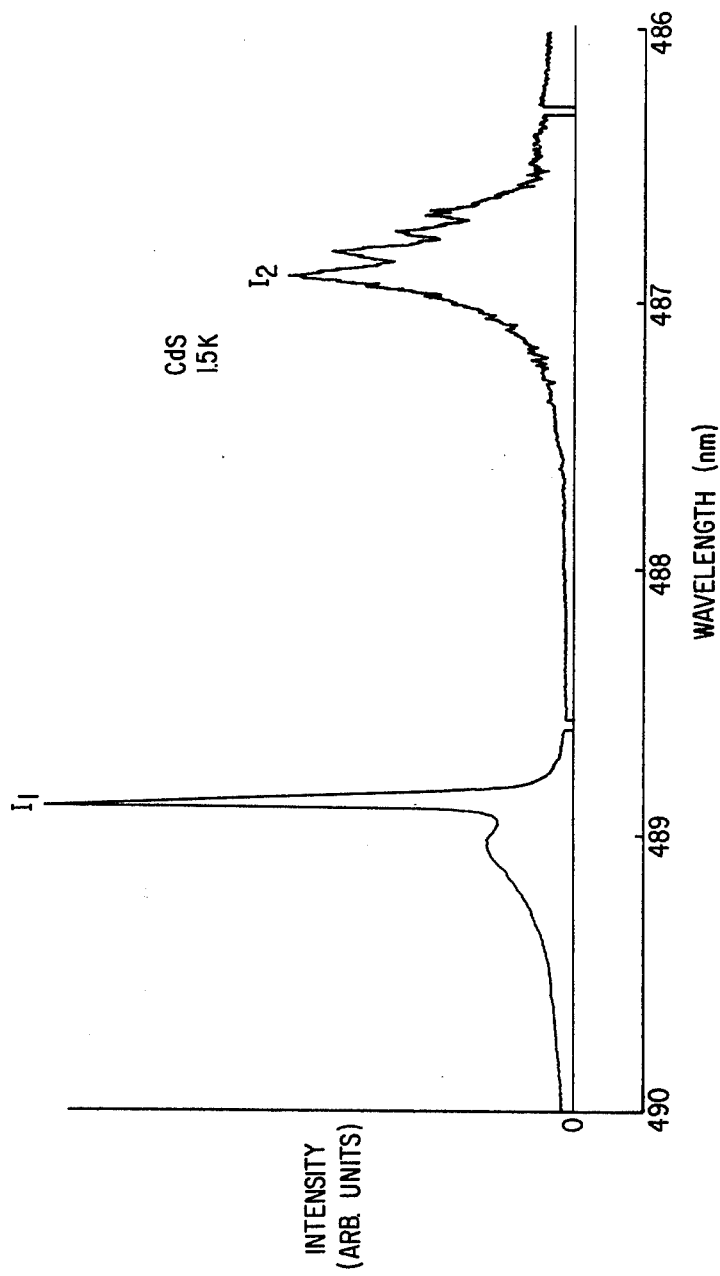

POLISHING OF CDS CRYSTALS

BACKGROUND OF THE INVENTION

The interest in crystalline cadmium sulfide for use in semiconductor and optical devices has engendered a corresponding interest in producing defect-free cadmium sulfide crystal surfaces. For example, the sensitivity of the CdS phonon spectrometer developed by Shah et al., (*Phys. Rev. Letters*, 33 (14), 818 (1974)), depends strongly on the surface quality of both the A and B face of the CdS crystal employed. Similarly, the optical qualities of a ZnO layer deposited on either the A or B face also depend on the quality of the CdS deposition surface. (See Rozgonyi and Polito, *J. Vac. Sci. and Tech.* 6(1), 115 (1969)).

Various methods have been investigated for CdS polishing. For example, Warekois et al., (*J. Appl. Phys.*, 33 (2), 690 (1961)) used a chemical etchant of 0.5M $K_2Cr_2O_7$ in 16N sulfuric acid as a polishing agent. However, dislocation etch pits on the sulfur surface (B) and shallow dishes on the cadmium (A) surface were reported. Other researchers have used a combination of mechanical and chemical steps to obtain a smooth surface. A method described by Sullivan and Bracht (*J. Electrochem. Soc.* 114 (3), 295 (1967)) entails first lapping the crystal with 5μm grit $Al_2O_3$ and then polishing with a Pellon cloth in the presence of hydrochloric acid (an aqueous solution of between 10 and 50% of 37% HCl in water). This procedure yielded a surface flat to within 0.1 mils.

Multicomponent etchants have also been used in a process involving both mechanical and chemical polishing. Pickhardt and Smith (*J. Electrochem. Soc.*, 121 (8), 1064 (1974)) have reported a process involving first mchanically polishing with a 3μm abrasive followed by polishing with a multicomponent mixture capable of both chemical and abrasive polishing. The multicomponent mixture contained 90 ml $HNO_3$, 300 ml precipitated silica, 10g $AlCl_3$ and 1 ml concentrated detergent solution per 1000 ml of deionized water. This process yielded A faces which were flat to 300 Angstroms. However, B faces polished with the same composition had scratches and an orange-peel texture. Slightly better B face surfaces were obtained by using a polishing agent consisting of 150 ml HCl and 5g $AlCl_3$ per 1000 ml of water. The Pickhardt and Smith polishing process even on the A face can yield significantly degraded results with changes in the complex nature of the agent. Increases or decreases in acid concentration, increases in the silica content, or deletion of $AlCl_3$ all produce surface irregularities. The composition of the polishing agent must, therefore, be very carefully controlled. This is an undesirable aspect of the method.

Despite these varied efforts a process involving a simple polishing agent capable of producing good surfaces, i.e., flat to less than 300 Angstroms on both the A and B faces in cadmium sulfide, for such applications as electrooptical devices, has not been developed. The continued investigation and use of devices whose quality depends on the surface properties of the CdS crystal utilized, emphasizes the need for a simple, easily controllable process for producing highly polished surfaces.

SUMMARY OF THE INVENTION

Buffered solutions of hydrochloric acid have been found to be excellent polishing agents capable of producing highly polished—flat to less than 300 Angstroms—CdS surfaces. The agent is efficacious for both the A and B faces. The quality of surface depends on the pH of the polish. For the cadmium face a pH range of about 2.2 to 2.8 preferably 2.4 to 2.6 is used. For the sulfur face a range of about 0.7 to 1.3 preferably 0.9 to 1.1 is employed. Because the polish is a buffered solution and because the only components are HCl, a buffering salt, and water, the composition of the polishing agent is easily established and maintained. Since the critical parameter is the pH, the etchant can be easily tested to ensure the appropriate properties before use, and the properties are easily maintained during use.

The final surface quality depends on the condition of the crystal before chemical polishing. Both the quality of the original mechanical polish and the crystal strain introduced by such polishing affects the surface quality achieved by the chemical polishing. Occasionally in a highly doped crystal an entire defective layer is exposed which yields a very irregular surface. In such case the crystal must be mechanically polished again and then chemicaly repolished.

BRIEF DESCRIPTION OF THE FIGURE

The FIGURE is a luminescence spectrum of a CdS surface polished by the method of the invention.

DETAILED DESCRIPTION

The use of a buffered hydrochloric acid solution to polish either the A or B face [(0001) plane] of a cadmium sulfide crystal advantageously produces highly polished surfaces which are useful in various device applications. The quality of the polish is sensitive to the pH of the acidic etchant solution. For the A or cadmium face a hydrochloric acid solution buffered to between about 2.2 and 2.8 inclusive, preferably between 2.4 and 2.6 inclusive yields desirable results. For the B or sulfur face a pH range between about 0.7 and 1.3 inclusive, preferably between 0.9 and 1.1 inclusive is appropriate. The solution is prepared by standard techniques, using a salt, e.g., potassium chloride, to buffer the hydrochloric acid.

The quality of the ultimate finish obtained by employing the chemical polish depends on the condition of the crystal surface before chemical polishing and on the processing history of the crystal i.e., the amount of strain introduced during processing. To obtain highly polished surfaces flat to at least 300 Angstroms, the crystal must be meticulously polished mechanically before chemical polishing. For example, the surface is polished with abrasives of decreasing grit until no improvement is observed under an interference microscope ($\times 510$ linear magnification) after polishing with an 0.5mμ grit abrasive. The procedure chosen to remove the surface defects before etching also should not produce damage or strain in the crystal. Either inadequate preparation of the surface or introduction of damage during this preparation degrades the surface quality obtained.

Crystal damage which as noted degrades the quality of the ultimate finish may result from the method of cutting from the bulk the crystal to be polished, from the abrasives used to mechanically polish the crystal or from the process used to introduce the chemical polish. String saws are exemplary of devices useful for cutting the crystal from the bulk without introducing unacceptable crystal damage. Strain introduced in mechanical polishing is dependent on the abrasive. In this regard the hardness of both the grit and the backing are significant. For example, 11μ silicone carbide on a glass plate is very hard and produces strain which in turn limits the surface quality obtainable by chemical polishing. Softer abrasives such as emery paper on a soft backing, e.g., Pellon cloth (a nonwoven fabric) are acceptable for sizing the crystal when highest quality is necessary. In the preferred embodiment the chemical polishing is done on a rotating soft pad mounted on a rigid plate and surrounded by a dressing ring. The soft pad, e.g., a pad made of CORFAM ®, a poromeric polyurethane synthetic leather, is again as in the mechanical process used to prevent the introduction of strain. The chemical polishing process typically takes from 2 to 4 hours during which the buffered solution of hydrochloric acid is dripped onto the soft pad.

Doped cadmium sulfide crystals are also polishable by the process of the invention. However, extended defects in such crystals are sometimes encountered. This prevents the production of highly polished surfaces. If an extended defect is observed after chemical polishing a good polish is still possible. The defect is eliminated, for example, by mechanical poishing to remove the crystal layer containing the defect, and a quality surface is obtainable by repeating the chemical polishing process.

The following examples illustrate the practice of the invention to produce cadmium sulfide crystals with highly polished A and B faces.

EXAMPLE 1

Three 1 mm thick cadmium sulfide wafers with areas of approximately 1 $cm^2$ each were cut from a bulk sample. The wafers were cut to expose the (0001) face using an oscillating string saw. A copper clad stainless steel string of approximately 0.2 mm diameter moving at a velocity of 5 m/sec was used in the saw. As the string moved a suspension of 2 parts by volume glycerol to 1 part 5 μm grit carborundum was dropped onto the string at a rate of approximately 2 drops (0.05 to 0.1 ml) per minute.

The wafers so cut were then treated for 2 minutes in an ultrasonic bath using a 1:1 mixture of concentrated hydrochloric acid and water. After this treatment the Cd face of the (0001) plane turned shiny while the S face remained mat. (See Sullivan and Bracht, *J. Electrochem. Soc.* 114, 295 (1967).) The Cd face of each wafer was identified. The wafers were mounted with the cadmium face exposed at the periphery of the face of a 2 inch diameter and 1½ inch high cylindrical stainless steel block. The wafers were equally spaced to prevent uneven polishing. They were first hand lapped using HYPREZ-W lubricant (a proprietary product of Engis Equipment Co., Morton Grove, Illinois) on a 3 μm emery paper (ULTRALAP-PFIZER) with a pressure sensitive backing, mounted on a flat glass plate. All handlapping was done in one straight line direction across the crystal surface. The CdS face was then further lapped using the same lubricant on 3 μm alumina paper (ULTRALAP-PFIZER) also mounted on a flat glass plate through a pressure sensitive back. This polishing step removed the mat finish left from the emery abrasive.

For the final hand lapping a Pellon cloth (a nonwoven fabric) with a pressure sensitive back was mounted on a glass plate. Paraffin wax was rubbed into the Pellon cloth with a flat sapphire disc. A small quantity of loose 0.3 μm alumina (Linde A) was spread on the Pellon cloth and a tallow base shaving cream was added as a lubricant. This was all rubbed into the Pellon cloth with a flat sapphire disc to maintain a flat and smooth surface. The cadmium face was then hand-lapped on this prepared abrasive. An abrasive composition was similarly prepared using a 0.05 μm alumina (Linde B) and the cadmium face was hand-lapped on this composition until any cross-hatch pattern was eliminated and no further improvement was observed under a Nomarski type contrast interference microscope (180 and 510 magnification). If a cross-hatch pattern or other defect could not be removed the entire abrasive polishing sequence was repeated to remove the defective layer of the crystal.

The wafer side of the disc was then placed on a Politex Pix pad (a pad made from CORFAM ®, a synthetic poromeric leather) which had been mounted on a motor driven stainless steel plate (6 inch diameter) surrounded by a stainless steel dressing ring. This pad was used because it is soft enough to prevent crystal damage but firm enough to maintain flatness. A hydrochloric acid solution buffered to a pH of about 2.5 (0.4 ml conc. HCl (37.2% HCl in water), 13.7 g KCl, 1000 ml. distilled water) was dripped onto the pad at a rate of about 3 ml/min. Weights were added to the top of the block to produce a pressure of 0.25 to 0.4 $kg/cm^2$ on the CdS. Polishing to reach a featureless finish took about 2 to 4 hours with a pad rotation rate of about 58 rpm.

The polished surface was examined with a Nomarski-type polarization interferometer ($\lambda$ = 546 nm) at 123× and 290× magnification. The observed interference pattern consisted of straight and parallel lines. This indicates a surface flat to at least 300 Angstroms (the resolution limit of the instrument).

A photoluminescence spectrum of the polished CdS at 1.5° Kelvin excited with a 457.9 nm argon laser beam was also taken on a Jarrell-Ash Mod. 25–104 spectrometer (see the FIGURE). Since the absorption length in CdS for the 457.9 nm line is only approximately 0.1 μm (B. Segall and P. T. F. Marple, "Intrinsic Exciton Absorption," in "Physics and Chemistry of II–VI Compounds," M. Aven and J. S. Prener, Editors; Wiley, New York, p. 372 (1967)), the luminescence spectrum is a good measure of surface quality. The luminescence spectrum obtained, (see the FIGURE,) is comparable to spectra of faces obtained by cleaving CdS crystals. (Cleaved faces are essentially damage free.) This again indicates an extremely high quality surface.

EXAMPLE 2

A similar procedure was followed for the sulfur face. It was mechanically polished as outlined in Example I and then chemically polished in a HCl solution buffered to a pH of 1.0 (16.0 ml conc. HCl, 13.3 g KCl, 1000 ml distilled water). Again the surface flatness was better than detectable with the resolution of the interferometer. The photoluminescence spectrum was also characteristic of a damage-free surface layer.

What is claimed is:

1. A process for polishing the cadmium face of a CdS crystalline material by contacting said cadmium face with a chemical polishing agent characterized in that said chemical polishing agent is a hydrochloric acid solution buffered to a pH in the range of about 2.2 to 2.8.

2. The process of claim 1 wherein said pH is in the range of 2.4 to 2.6.

3. A process for polishing the sulfur face of a CdS crystalline material by contacting said sulfur face with a chemical polishing agent characterized in that said chemical polishing agent is a hydrochloric acid solution buffered to a pH in the range of about 0.7 to 1.3.

4. The process of claim 3 wherein said pH is in the range of 0.9 to 1.1.

* * * * *